United States Patent [19]

Cherukuri et al.

[11] Patent Number: 4,796,083
[45] Date of Patent: Jan. 3, 1989

[54] SEMICONDUCTOR CASING

[75] Inventors: Satyam C. Cherukuri, West Haven, Conn.; Sheldon H. Butt, Godfrey, Ill.

[73] Assignee: Olin Corporation, New Haven, Conn.

[21] Appl. No.: 69,125

[22] Filed: Jul. 2, 1987

[51] Int. Cl.⁴ .................. H01L 23/02; H01L 23/12; H01L 23/30; H01L 23/48
[52] U.S. Cl. .................... 357/74; 357/73; 357/67
[58] Field of Search .................. 357/73, 74, 67

[56] References Cited

U.S. PATENT DOCUMENTS

| | | | |
|---|---|---|---|
| 3,676,292 | 7/1972 | Pryor et al. | 428/433 |
| 3,726,987 | 4/1973 | Pryor et al. | 174/50.61 |
| 4,149,910 | 4/1979 | Popplewell | 148/6.35 |
| 4,491,622 | 1/1985 | Butt | 428/632 |
| 4,500,605 | 2/1985 | Fister et al. | 428/469 |
| 4,524,238 | 6/1985 | Butt | 357/74 |
| 4,532,222 | 7/1985 | Butt | 501/32 |
| 4,542,259 | 9/1985 | Butt | 174/52 FP |
| 4,570,337 | 2/1986 | Butt | 29/840 |
| 4,577,056 | 3/1986 | Butt | 174/52 FP |
| 4,607,276 | 7/1986 | Butt | 357/79 |
| 4,649,083 | 3/1987 | Fister et al. | 428/469 |
| 4,656,499 | 4/1987 | Butt | 357/74 |
| 4,682,414 | 7/1987 | Butt | 29/840 |
| 4,704,626 | 11/1987 | Mahulikar et al. | 357/74 |
| 4,712,161 | 12/1987 | Pryor et al. | 361/411 |
| 4,725,333 | 2/1988 | Leedecke et al. | 156/630 |

FOREIGN PATENT DOCUMENTS

| | | | |
|---|---|---|---|
| 86144 | 6/1980 | Japan | 357/74 |
| 42156 | 2/1986 | Japan | 357/73 |

Primary Examiner—Eugene R. Laroche
Assistant Examiner—Michael B. Shingleton
Attorney, Agent, or Firm—Gregory S. Rosenblatt; Paul Weinstein

[57] ABSTRACT

A hermetic semiconductor casing for an electrical component has a metal or metal alloy leadframe with first and second opposite surfaces each having a first refractory oxide layer thereon, which leadframe is adapted to have the electrical component connected thereto. The leadframe is bonded by means of a fired glass or ceramic to a metal or metal alloy base member. The base member has a relatively thin metal or metal alloy coating on at least the top surface and the sides thereof, with the coating having a desirable refractory oxide layer on the outer surface thereof. The leadframe is also bonded by means of a fired glass or ceramic to a metal or metal alloy cap member having a refractory oxide layer on the lower surface thereof. The coating on the base member allows use of a base member that has undesirable oxide forming characteristics. Its thinness improves heat transfer over the use of cladding and its oxide layer on the sides of the base member provides for bonding to any glass that may flow over the edge of the base during firing that could otherwise break or spall off and cause faults in the dielectric separation of the base and the leadframe and destroy the hermetic seal of the casing.

10 Claims, 1 Drawing Sheet

SEMICONDUCTOR CASING

While this invention is subject to a wide variety of applications, it relates to semiconductor casings in general and more particularly to an improved structure for hermetically sealed semiconductor casings, which improves the quality and reliability thereof.

Typically, a hermetically sealed semiconductor casing includes a ceramic base substrate member to which a metalized spot is applied to provide for later attachment thereto of a semiconductor chip. Next, a layer of sealing glass is silk screened as a paste around the periphery of the base member. Then, a leadframe is placed upon the glass and the resulting subassembly is passed through a furnace so that the glass fuses, bonding to the base member as well as to the leadframe. Following next, the chip is bonded to the metalized spot on the substrate. Finally, an upper cap having sealing glass silk screened upon the lower surface thereof is placed over the resulting subassembly which is again fired so as to fuse the glass, thus bonding the package together into a single hermetic unit.

It is well-known that, to provide a good glass-to-metal alloy bond, it is desirable to have an oxide layer on the surface of the metal. Certain alloys which provide a desirable oxide surface as well as other techniques for forming hermetically sealed semiconductor casings are discussed in U.S. Pat. No. 4,656,499 issued Apr. 7, 1987 to Sheldon H. Butt, assigned to the assignee of the present invention, which patent and the references noted therein are incorporated herein by reference. Such alloys as described are those which do not form excessively thick oxide layers under the temperature and oxidation conditions normally used because of the restraint upon oxide formation kinetics provided by the formation of refractory oxides on the surface. These refractory oxides have the effect of limiting the amount of oxide formed.

There are certain other copper alloys whose other properties, such as strength, thermal conductivity, etc., would be desirable for use in semiconductor packages, but whose oxidation behavior is such that excessively thick oxide films are formed. An alloy of such type is the copper alloy C7025. This alloy as well as others in the class of other desirable materials can be satisfactorily glass bonded if it is clad with an alloy which forms a desirable oxide coating as described above. Cladding, however, has two disadvantages: first, it is relatively thick, up to several mils thick, and such thickness may lead to poor thermal conductivity from the semiconductor device to the base substate member. Second, it is not convenient to cover the edges of the substrate. The latter factor may result in the problem that, when the glass is fired, the lower glass layer may flow out and around the edge of the cladding and over the substrate, which in accordance with the above discussion forms a poor bond with the glass. This glass overlying the substrate is subject to being easily broken or spalling off the substrate, which may cause cracks and gaps in the upper layer, thus possibly causing faults in the dielectric separation of the leadframe and the base alloy and possibly destroying the hermetic seal.

Accordingly, it is a principle object of the present invention to provide a relatively thin coating material between the substrate and the leadframe, which material will exhibit the proper surface oxidation characteristics, and which coating material extends over the exposed edges of the substrate. One material that is found to be particularly valuable is electroplated nickel, although other materials applied with electroplating or by other methods may be used as well.

Other objects, as well as means and advantages, of the invention will be apparent or will in part appear hereinafter.

Figure 1:
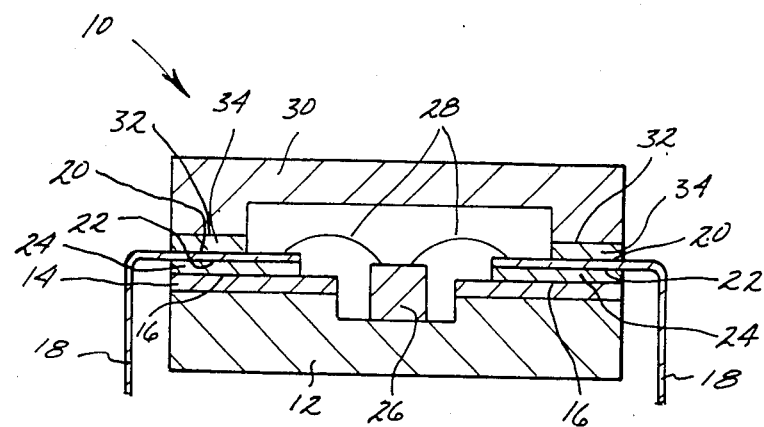
FIG. 1 is a cross-sectional view of a hermetically sealed semiconductor device having a cladded base member constructed according to conventional methods.

Referring now to the drawing, FIG. 1 shows a hermetically sealed semiconductor device 10 of conventional construction having a base member 12 with a relatively thick cladding 14 on the upper surface thereof. Cladding 14 has a refractory oxide upper surface 16. A leadframe 18 has upper and lower surfaces 20 and 22, respectively, with a refractory oxide layer on each surface. A first fused glass layer 24 bonds the leadframe 18 to the upper surface 16 of the cladding 14. Fixed on the surface of the base member 12 is a semiconductor 26 which is attached to the leadframe 18 by conductors 28. Completing the device is a cap 30 the lower surface 32 of which is oxidized for bonding by means of a second fused glass layer 34 to the leadframe 18 and the first fused glass layer 24, thus hermetically sealing semiconductor 27.

It can be understood that, during the process by which leadframe 18 is attached to base 12 by fusion of the first glass layer 24, some of that glass layer may flow out and over the side of cladding 14 and contact the side of base member 12. As can be appreciated from the discussion above, any glass so contacting the side of base member 12 would be subject to spalling, thereby causing breaks and cracks of the layer of glass 18 between cladding 14 and leadframe 18, thus possibly causing faults in the dielectric separation of those two members and possibly destroying the hermetic seal.

Figure 2:
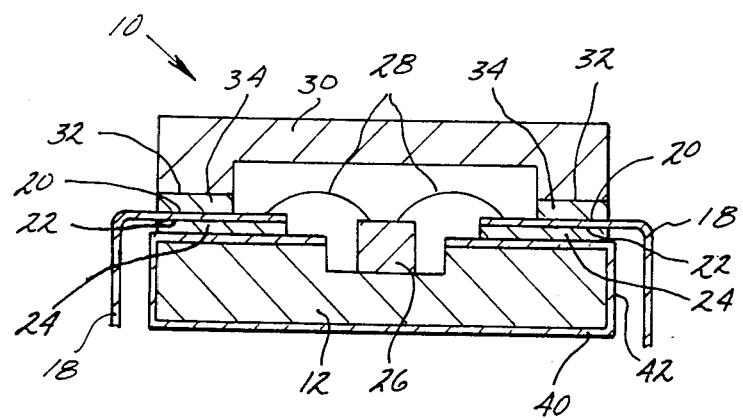
FIG. 2 is cross-sectional view of a hermetically sealed semiconductor device constructed according to the present invention.

FIG. 2 is a cross-sectional view of the device 10 of FIG. 1 constructed according to the present invention. Here rather than having a relatively thick cladding layer 14 as shown on FIG. 1, the base member 12 has been coated, through one of the methods noted below, with a coating of a relatively thin material 40 the outer surface 42 of which is oxidized for bonding to the first glass layer 24. It will be understood that the thickness of coating 40 is shown greatly out of proportion to the thickness of base member 12, the coating being, in actuality, perhaps several orders of magnitude thinner than cladding 14 on FIG. 1. Typically, cladding would be in the range of 5 to 100 mils thick, while plated material would be a few microns thick. It can be seen from FIG. 2 that should any glass flow over the upper edge of base member 12 during the process by which the base member 12 is attached to leadframe 18, such overflow glass will only contact the oxidized surface of the coating material and bond to it, thus avoiding the problems of spalling as noted with reference to FIG. 1 above.

While the coating 40 on the substrate base member 12 is shown as entirely enclosing the base member, which is the structure likely resulting from most application methods, it will be understood that in practicing the present invention, only the top and sides of the base member need to be coated as a minimum.

The coating 40 used may be applied by any convenient means, including electroplating, chemical vapor deposition, or sputtering. It should be recognized that, although some of the coating systems may be conveniently applied by any of these means, in the case of some other coating systems, the available means are limited. It should also be noted that, in the case of some of the desirable coating systems, it is necessary, as further described below, to interpose a diffusion barrier coating between the base member 12, the coating 40 in order to prevent loss of the coating on the surface of the base member by interdiffusion with the material of the base member.

The critical temperature range over which the thickness of oxide formed must be limited is 400° C. to 500° C. and, in addition, it is prefered that the desired oxidation characteristics be maintained up to the higher temperature of 600° C. Within this temperature range, the minimum thickness of oxide forming at the lowest temperature of 300° C. and at the minimum time of one minute should preferably be 50 Angstroms. At the maximum temperature (500° C. or 600° C.) and at the maximum time of exposure in air of 30 minutes, the oxide film thickness should preferably not exceed 5,000 Angstroms and most preferably, not exceed 1,000 Angstroms.

Examples of coating systems which may be employed to provide a suitable coating follow:

Nickel. Nickel plating has been found to be useful. In addition to being provided as a plating, a nickel coating can also be made available by other means including chemical vapor deposition and sputtering. Furthermore, the "nickel" coating may be pure nickel, or it may be an alloy of nickel. When provided as an alloy, it should offer desirable oxidation characteristics. Some of the alloys which may be used include nickel alloys with tin, chromium, and/or cobalt, copper, among others.

Cobalt. Cobalt and appropriate cobalt alloys may be used as an alternative to nickel as described above.

Chromium. Chromium and alloys of chromium may be used as a coating. When used as a plating coating, it is desirable that an undercoat, such as a nickel undercoat, be applied between it and the bulk copper alloy. This is necessary because chromium is characteristically brittle and is therefore, applied in a very thin layer which may be porous.

Molybdenum and Tungsten. Molybdenum and tungsten may be used as an alternate to chromium. The most desirable means of providing coatings of these metals and their alloys are by sputtering and chemical vapor deposition.

Tin. Tin, forming tin oxide, may also be used. However, a diffusion barrier, typically nickel or cobalt, between the tin coating and the bulk copper alloy is very desirable. The tin coating is limited in thickness to that thickness, which after allowing for interdiffusion with the copper alloy base and/or with the intervening diffusion barrier, will generate oxide layers no thicker than the limitations established above when all of the available tin has been converted to oxide. No tin metal, as such, should remain.

Silicon and Germanium. Silicon and germanium may be used as coatings; however, these materials may not be plated by normal plating methods and thus, sputtering and chemical vapor deposition become the preferred methods of coating with these elements and their alloys. Since coating thicknesses obtained by chemical vapor deposition and/or by sputtering are typically quite thin the use of a diffusion barrier, typically nickel or cobalt, between these coatings and the copper or copper alloy base is particularly desirable.

Titanium, Zirconium, and Hafnium. These metals and their alloys may be used and have desirable oxidation characteristics. Interdiffusion with copper and copper alloy material is quite slow and these metals may be used as thin, sputtered or chemical vapor deposited coatings. Because of their slow interdiffusion with the bulk copper or copper alloy, coatings with these metals are also particularly adaptable to use as diffusion barriers with other final coatings.

Aluminum. Aluminum may be used as a coating. A suitable barrier, typically nickel or cobalt, between the aluminum and the bulk copper alloy is needed to avoid excessive interdiffusion.

Niobium and Tantalum. These metals and their alloys may also be used as coatings.

In addition to coating the bulk copper alloy with one or another of the various metal alloy systems noted above, the desired copper alloy coating may be formed upon the bulk copper alloy in situ, as, for example, by vapor deposition of a thin layer of aluminum on the bulk copper alloy, followed by interdiffusion, so as to generate a surface layer of copper-aluminum alloy. The thickness of the aluminum coating and the diffusion process to be used in the case of this example must be established such that excessive aluminum does not remain in or near the surface of the coated material to the extent that the brittle copper-aluminum intermetallic will be present after interdiffusion.

All of the preceding systems described and discussed are to be considered as examples, it being understood that other coatings fulfilling the criteria established may be devised as well by one skillful in the art to provide a relatively thin material having desired oxidation characteristics at the surface of the base material.

In one case, nickel was electroplated using conventional methods to provide a coating about 3 microns thick. This thickness has been found to provide an adequate oxygen diffusion barrier. Such a thickness may be applied, for example, using a sulfamate electroplating bath containing 2 oz. per gallon nickel chloride, 50 oz. per gallon nickel sulfamate, and 5 oz. per gallon boric acid, under the conditions of ph 4 and 120° F., with a cathode current density of $19A/ft^2$, applied for about 10 minutes.

Whatever method is employed for forming the coating, the particular process does not form part of the present invention. Technology for plating various metals is disclosed in *Electroplating Technology Recent Developments* J. I. Duffy Editor, published by Noyes Data Corporation, Park Ridge, N.J. in 1981, which is incorporated herein by reference.

It is apparent that there has been provided in accordance with this invention an improved hermetically sealed semiconductor casing for an electrical component which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A semiconductor casing for an electrical component, comprising:
   a metal or metal alloy leadframe having first and second opposite surfaces and being adapted to have said electrcial component connected thereto, each of said first and second surfaces having a first thin adherent oxide layer thereon;
   a metal or metal alloy base member having first and second opposite surfaces with sides therebetween;
   said base member having a relatively thin metal or metal alloy coating on at least the first surface and the sides thereof, the coating having a second thin adherent oxide layer on the outer surface thereof;
   a metal or metal alloy cap member containing a bonding surface and a third thin adherent oxide layer on said bonding surface thereof; and
   a glass or ceramic component bonding said first and second thin adherent oxide layers and said first and third thin adherent oxide layers.

2. The casing of claim 1 wherein said coating is selected from the group consisting of nickel, cobalt, chromium, molybdenum, tungsten, titanium, zirconium, hafnium, niobium, tantalum, alloys of the foregoing metals, tin, silicon, germanium, and aluminum.

3. The casing of claim 1 wherein said coating is applied by electroplating such that said coating is up to about 3 microns in thickness.

4. The casing of claim 1 wherein said coating is applied by chemical vapor deposition such that the thickness of said coating is substantially less than 3 microns.

5. The casing of claim 1 wherein said coating is applied by sputtering such that the thickness of said coating is substantially less than 3 microns.

6. The casing of claim 3 wherein said coating is nickel.

7. The casing of claim 1 wherein said substrate is a copper alloy and said coating is copper-aluminum alloy formed in situ by vapor deposition of aluminum upon said substrate followed by interdiffusion so as to generate said copper-aluminum alloy.

8. The casing of claim 1 wherein said glass or ceramic component hermetically seals said semiconductor.

9. The casing of claim 1 wherein the thickness of said second thin adherent oxide layer is less than about 5000 angstroms.

10. The casing of claim 9 wherein the thickness of said second thin adherent oxide layer is less than about 1000 angstroms.

* * * * *